United States Patent
Kim et al.

(10) Patent No.: US 8,624,354 B2
(45) Date of Patent: Jan. 7, 2014

(54) SEMICONDUCTOR DEVICES INCLUDING 3-D STRUCTURES WITH SUPPORT PAD STRUCTURES AND RELATED METHODS AND SYSTEMS

(75) Inventors: Shin-hye Kim, Suwon-si (KR); Kyung-mun Byun, Seoul (KR); Hong-rae Kim, Seoul (KR); Gil-heyun Choi, Seoul (KR); Eun-kee Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 432 days.

(21) Appl. No.: 12/829,864

(22) Filed: Jul. 2, 2010

(65) Prior Publication Data
US 2011/0115051 A1    May 19, 2011

(30) Foreign Application Priority Data
Nov. 19, 2009    (KR) .................. 10-2009-0112188

(51) Int. Cl.
*H01L 21/02*    (2006.01)

(52) U.S. Cl.
USPC .................................. 257/532; 257/E29.342

(58) Field of Classification Search
USPC .......................................... 257/532, E29.342
See application file for complete search history.

(56) References Cited

U.S. PATENT DOCUMENTS

| | | | |
|---|---|---|---|
| 6,391,710 B1 * | 5/2002 | Moore et al. .................. | 438/253 |
| 6,436,760 B1 | 8/2002 | Wong et al. | |
| 6,445,565 B1 | 9/2002 | Toyoda et al. | |
| 6,853,023 B2 | 2/2005 | Goebel et al. | |
| 7,311,857 B2 | 12/2007 | Ko et al. | |
| 7,314,795 B2 | 1/2008 | Yeo et al. | |
| 7,387,939 B2 | 6/2008 | Manning | |
| 7,449,391 B2 * | 11/2008 | Manning et al. .............. | 438/396 |
| 8,017,491 B2 * | 9/2011 | Lee et al. ....................... | 438/386 |
| 2004/0110340 A1 | 6/2004 | Kim et al. | |
| 2005/0051822 A1 * | 3/2005 | Manning ....................... | 257/296 |
| 2005/0054159 A1 | 3/2005 | Manning et al. | |

(Continued)

FOREIGN PATENT DOCUMENTS

| | | |
|---|---|---|
| JP | 2003-142605 | 5/2003 |
| KR | 1020030075907 A | 9/2003 |

(Continued)

OTHER PUBLICATIONS

Korean Notice to Submit Response and English Translation corresponding to Korean Patent Application No. 10-2007-0057995, Mar. 21, 2008, 8 pages.

*Primary Examiner* — David Vu
*Assistant Examiner* — Brandon Fox
(74) *Attorney, Agent, or Firm* — Myers Bigel Sibley & Sajovec, P.A.

(57) ABSTRACT

A semiconductor device may include a semiconductor substrate and a plurality of three-dimensional capacitors on the semiconductor substrate. Each of the plurality of three-dimensional capacitors may include a first three-dimensional electrode, a capacitor dielectric layer, and a second three-dimensional electrode with the first three-dimensional electrode between the capacitor dielectric layer and the semiconductor substrate and with the capacitor dielectric layer between the first and second three-dimensional electrodes. A plurality of capacitor support pads may be provided with each capacitor support pad being arranged between adjacent first three-dimensional electrodes of adjacent three-dimensional capacitors with portions of the capacitor dielectric layers between the capacitor support pads and the semiconductor substrate. Related methods and apparatuses are also discussed.

23 Claims, 11 Drawing Sheets

(56) References Cited

U.S. PATENT DOCUMENTS

| | | |
|---|---|---|
| 2006/0113633 A1 | 6/2006 | Park et al. |
| 2008/0009119 A1* | 1/2008 | Eto ............................... 438/386 |
| 2009/0068814 A1* | 3/2009 | Cho et al. ...................... 438/386 |
| 2009/0224293 A1* | 9/2009 | Miyanami ..................... 257/288 |
| 2011/0198675 A1* | 8/2011 | Ng et al. ....................... 257/288 |

FOREIGN PATENT DOCUMENTS

| | | |
|---|---|---|
| KR | 1020050002358 A | 1/2005 |
| KR | 1020050043406 A | 5/2005 |
| KR | 1020060007727 A | 1/2006 |
| KR | 100885922 B1 | 2/2009 |

* cited by examiner

| Process Performance | HTSiN | C-HTSiN1 | C-HTSiN2 |
|---|---|---|---|
| Deposition Temperature (°C) | 550 | 550 | 550 |
| Dep Rate (Å/min) | 1500 | 1600 | 1480 |
| Stress (MPa) | 270 | 330 | 500 |
| Thk Uniformity (R/2 %) | < 3% | < 3% | < 3% |
| WER (Å/min) | 12 | 3.6 | 3 |

SEMICONDUCTOR DEVICES INCLUDING 3-D STRUCTURES WITH SUPPORT PAD STRUCTURES AND RELATED METHODS AND SYSTEMS

RELATED APPLICATION

This application claims the benefit of priority of Korean Patent Application No. 10-2009-0112188, filed on Nov. 19, 2009, in the Korean Intellectual Property Office, the disclosure of which is incorporated herein in its entirety by reference.

BACKGROUND

The present invention relates to electronics, and more particularly, to semiconductor devices and methods of fabricating the same.

Increases in integration densities of semiconductor devices, such as dynamic random access memory (DRAM) devices, has led to reductions in the area occupied by various semiconductor elements in the semiconductor devices. Capacitances of memory cells, however, should be maintained and/or increased. Methods used to ensure a sufficient cell capacitance within a limited area include use of a high dielectric material for a dielectric layer, reducing the thickness of a dielectric layer, and increasing the effective area of a lower electrode. Of these methods, increasing the effective area of a lower electrode has been employed most often in practical processes.

To increase the effective area of the lower electrode, three-dimensional lower electrodes (such as cylindrical or fin shaped or stack type lower electrodes), hemispherical grains (HSGs) on lower electrodes, and increased heights of lower electrodes have been proposed. In the case of cylindrical or stack type lower electrodes, external surfaces of both of the external and internal surfaces of the lower electrodes may be used, so that the lower electrodes may have relatively large effective areas. However, for cylindrical or stack type lower electrodes having an integrated one cylinder stack (OCS) structure, heights of the lower electrodes should be increased to ensure a capacitance sufficient for operation of a semiconductor device.

SUMMARY

According to some embodiments of the present invention, a semiconductor device may include a semiconductor substrate and a plurality of three-dimensional capacitors on the semiconductor substrate. Each of the plurality of three-dimensional capacitors may include a first three-dimensional electrode, a capacitor dielectric layer, and a second three-dimensional electrode with the first three-dimensional electrode between the capacitor dielectric layer and the semiconductor substrate and with the capacitor dielectric layer between the first and second three-dimensional electrodes. A plurality of capacitor support pads may be provided with each capacitor support pad being arranged between adjacent first three-dimensional electrodes of adjacent three-dimensional capacitors with portions of the capacitor dielectric layers between the capacitor support pads and the semiconductor substrate.

According to some other embodiments of the present invention, an electronic system may include an input/output unit through which data is input and/or output, an interface unit configured to receive and/or transmit the data, and a semiconductor device. The semiconductor device may include a semiconductor substrate, and a plurality of three-dimensional capacitors on the semiconductor substrate. Each of the plurality of three-dimensional capacitors may include a first three-dimensional electrode, a capacitor dielectric layer, and a second three-dimensional electrode with the first three-dimensional electrode between the capacitor dielectric layer and the semiconductor substrate and with the capacitor dielectric layer between the first and second three-dimensional electrodes. The semiconductor device may also include a plurality of capacitor support pads with each capacitor support pad being arranged between adjacent first three-dimensional electrodes of adjacent three-dimensional capacitors with portions of the capacitor dielectric layers between the capacitor support pads and the semiconductor substrate. In addition, a controller may be configured to control the input/output unit, the interface unit, and the semiconductor device, and a bus may be configured to provide communications coupling among the input/output unit, the interface unit, the semiconductor device, and the controller.

According to still other embodiments of the present invention, a method of forming a semiconductor device may include providing a semiconductor substrate including a plurality of conductive layers thereon and forming a mold oxide layer on a semiconductor substrate and on the conductive layers. A support pad layer may be formed on the mold oxide layer with the support pad layer and the mold oxide layer comprising different materials. A plurality of holes may be formed through the plurality of support pad layers and the mold oxide layer with each hole exposing a portion of a respective one of the conductive layers. A plurality of first three-dimensional electrodes may be formed with each of the first three-dimensional electrodes being formed on sidewalls of a respective one of the holes. The support pad layer may be patterned to form a plurality of capacitor support pads, with each of the capacitor support pads being arranged between adjacent first three-dimensional electrodes in a stripe. Capacitor dielectric layers may be formed on the first three-dimensional electrodes, and second three-dimensional electrodes may be formed on the capacitor dielectric layers to thereby define a plurality of three-dimensional capacitors.

Embodiments of the present invention may provide a semiconductor device with a capacitor having an integrated one cylinder stack (OCS) structure where collapse/tearing at a cell block edge (which is a boundary of a cell region) may be reduced.

According to some embodiments of the present invention, a semiconductor device may include a semiconductor substrate in which a cell region is defined. A plurality of capacitors may be formed in the cell region, the capacitors having cylindrical lower electrodes, dielectric layers, and upper electrodes. A plurality of capacitor support pads may be formed in stripes between adjacent lower electrodes and may include a material having a tensile stress which is greater than a predetermined value and that is resistant to wet etching.

The plurality of capacitor support pads may have relatively low density to increase the tensile stress and may be doped with a predetermined element that is resistant to wet etching. For example, the plurality of capacitor support pads may be carbon-doped silicon nitride (C—SiN) layers formed by plasma enhanced chemical vapor deposition (PECVD) or low pressure CVD (LPCVD). The tensile stresses of the plurality of capacitor support pads may be in the range of about 50 to 1000 MPa.

According to some embodiments of the present invention, an apparatus may include an input/output unit through which data is input or output. An interface unit may receive and/or transmit the data. A semiconductor device as discussed above may store the data. A controller may control the input/output unit, the interface unit, and the semiconductor device. A bus may transmit data and commands among the input/output unit, the interface unit, the semiconductor device, and the controller.

According to some embodiments of the present invention, a method of fabricating a semiconductor device may include forming a mold oxide layer to completely cover a semiconductor substrate in which a cell region is defined. A plurality of support pad layers may be formed on the mold oxide layer using a material, the tensile stress of which is greater than a predetermined value and that is resistant to wet etching. A plurality of holes may be formed by etching the mold oxide layer and the plurality of support pad layers to expose a conductive layer formed on the semiconductor substrate. A plurality of cylindrical lower electrodes may be formed by applying a conductive material onto inner walls of the holes. A plurality of capacitor support pads may be formed in stripes by etching the plurality of support pad layers in a predetermined pattern, where the plurality of capacitor support pads connect adjacent cylindrical lower electrodes. Dielectric layers and upper electrodes may be formed on the cylindrical lower electrodes.

The plurality of support pad layers may include at least one silicon source gas selected from the group consisting of DCS ($SiH_2Cl_2$), HCD($Si_2Cl_6$), TCS($SiHCl_3$), $SiH_4$, and BTBAS (($C_4H_9NH)_2SiH_2$), a $C_xH_y$ gas, an $N_2$ gas, and a $NH_3$ gas. The plurality of support pad layers may be silicon nitride (SiN) layers formed by plasma enhanced chemical vapor deposition (PECVD) or low pressure CVD (LPCVD), and may include 2% to 6% of carbon by mass to increase resistance to wet etching.

BRIEF DESCRIPTION OF THE DRAWINGS

Examples of embodiments of the present invention will be more clearly understood from the following detailed description taken in conjunction with the accompanying drawings in which.

DETAILED DESCRIPTION OF THE EMBODIMENTS

Figure 1A:
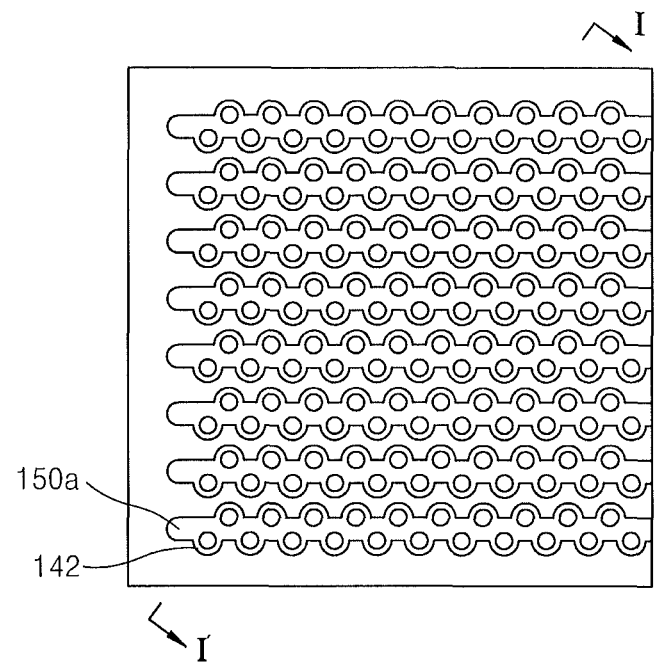
FIGS. 1A to 1D are plan views of semiconductor devices each having a plurality of one cylinder stack (OCS)-structured capacitors, illustrating various array patterns of a plurality of capacitor support pads, according to embodiments of the present invention.

Advantages and features of the present invention and methods of accomplishing the same may be understood more readily by reference to the following detailed description of embodiments and the accompanying drawings. The present invention may, however, be embodied in many different forms and should not be construed as being limited to embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the present invention.

Unless otherwise defined, all terms (including technical and scientific twits) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In the drawings, the illustrated features may be changed due to, for example, the manufacturing technology and/or tolerance. Accordingly, it should be understood that the example embodiments of the inventive concept are not limited to the drawings but include modifications of the features of elements caused due to, for example, the manufacture.

FIGS. 1A to 1D are plan views of semiconductor devices each having a plurality of one cylinder stack (OCS)-structured capacitors, illustrating various array patterns of a plurality of capacitor support pads, according to embodiments of the present invention.

FIG. 1A is a plan view of the semiconductor device with an array pattern of capacitor support pads 150a, according to some embodiments of the present invention. In the semiconductor device of current embodiments, the capacitor support pads 150a are arranged in stripes in a row direction to form a plurality of rows. Each pair of lines of cylindrical lower electrodes 142 is supported by one of the capacitor support pads 150a. Each of the capacitor support pads 150a extends to a boundary portion of a cell region, i.e., to a cell block edge which is a boundary of a cell region, in consideration of an amount of capacitor support pad material that melts during wet etching of a mold oxide layer performed when the cylindrical lower electrodes 142 are formed.

Figure 1B:
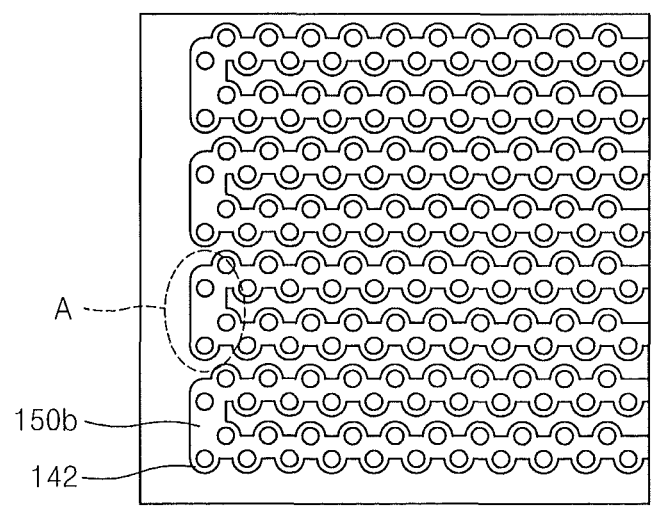

FIG. 1B is a plan view of the semiconductor device with an array pattern of capacitor support pads 150b, according to other embodiments of the present invention. In the semiconductor device of current embodiments, the array pattern of capacitor support pads 150b is formed in stripes similar to those of FIG. 2A. Pairs of capacitor support pads 150b formed in stripes are connected to each other at cell block edges, however, as shown in the dashed circle A.

Figure 1C:
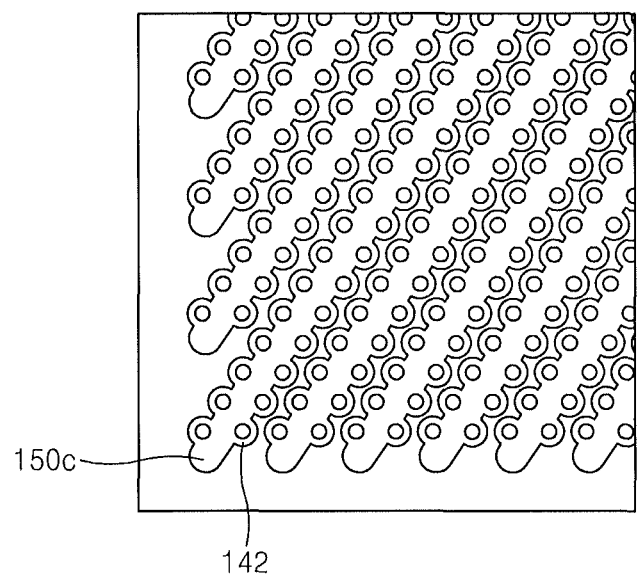

FIG. 1C is a plan view of the semiconductor device with an array pattern of capacitor support pads 150c, according to other embodiments of the present invention. In the semiconductor device of FIG. 1C, the capacitor support pads 150c are arranged in stripes in a diagonal direction to form a plurality of diagonal lines. The capacitor support pads 150c extend to a cell block edge in consideration of an amount of capacitor support pad material that melts during wet etching of a mold oxide layer as described above.

Figure 1D:
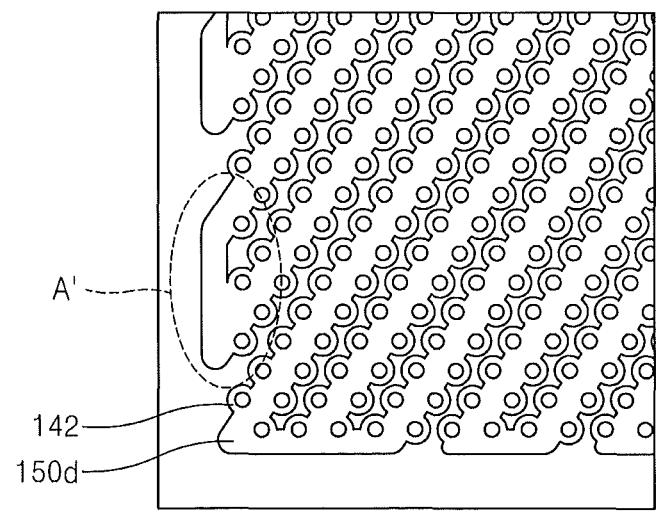

FIG. 1D is a plan view of the semiconductor device with an array pattern of capacitor support pads 150d, according to other embodiments of the present invention. The array pattern of capacitor support pads 150d are arranged in stripes similar to that of FIG. 1C. Pairs of the capacitor support pads 150d are connected to each other at cell block edges, however, as shown in dashed circle A'. Although in FIGS. 1B and 1D, each of two of the capacitor support pads 150b and 150d are connected to each other at the cell block edges A and A', respectively, all of or each of three or more of the capacitor support pads 150b or 150d may be connected to each other.

A variety of patterns of capacitor support pads are illustrated in FIGS. 1A to 1D. The semiconductor devices of FIGS. 1A and 1C may provide improved electrical characteristics. In addition, capacitor support pads extending parallel in diagonal lines instead of rows or columns may be more advantageous to provide a space between the cylindrical lower electrodes 142 and to maintain symmetry during deposition of subsequent materials. That is, the array pattern of the capacitor support pads 150c formed in stripes as illustrated in FIG. 1C may provide an improved structure. Although the capacitor support pads 150a, 150b shown in FIGS. 1A and 1B extend in parallel in rows or diagonal lines, capacitor support pads that extend in parallel in columns may also be used.

In the above embodiments, the capacitor support pads 150a to 150d may be formed of a material, having a tensile stress which is greater than a predetermined level and having resistance to wet etching. Therefore, collapsing or tearing of capacitors 150a to 150d may be reduced at a cell block edge which is a boundary of a cell region. The material of the capacitor support pads 150a to 150d will be described in more detail with reference to FIGS. 4 to 8.

Figure 2:
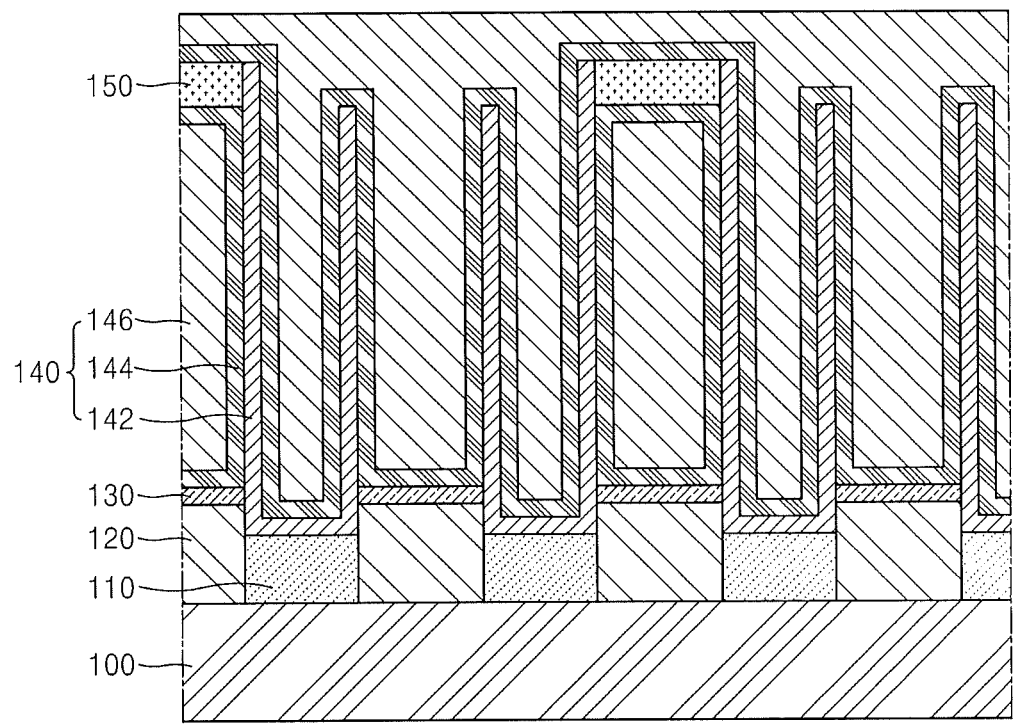
FIG. 2 is a cross-sectional view taken along the line I-I of FIG. 1A.

FIG. 2 is a cross-sectional view taken along the line I-I of FIG. 1A. Referring to FIG. 2, the semiconductor device includes semiconductor substrate 100, OCS-structured capacitors, i.e., cylindrical capacitors 140, which are formed on semiconductor substrate 100, and capacitor support pads 150 supporting cylindrical lower electrodes 142 of cylindrical capacitors 140.

The semiconductor substrate 100 includes a cell region and a peripheral or core region outside of the cell region, but only the cell region is shown for the convenience of description. Contact lines 110 (connected to conductive regions of the cell region) and inter-layered insulation layers 120 are formed on the semiconductor substrate 100. The contact lines 110 may be a layer electrically connecting the conductive regions of the cell region with the cylindrical lower electrodes 142 of the capacitors 140, and may be, for example, storage node contact plugs.

Each of the capacitors 140 (including cylindrical lower electrode 142, dielectric layer 144, and upper electrode 146) is disposed on one of the contact lines 110. Generally, cylindrical lower electrodes 142 may be formed to have a height of 10,000 Angstroms or greater, and an aspect ratio thereof may be increased. Therefore, the capacitor support pads 150 may be formed to reduce collapsing of the cylindrical lower electrodes 142. In FIG. 2, the semiconductor substrate 100 also includes an etch-stop layer 130 formed of silicon nitride (SiN) or the like.

Capacitor support pads 150 may be formed between upper portions of the cylindrical lower electrodes 142 but may be parallel in stripes between the cylindrical lower electrodes 142 in various ways as described above with reference to FIGS. 1A to 1D. Capacitor support pads 150 may be formed of a material having an etching selectivity that is lower than that of a mold oxide layer used to form the cylindrical lower electrodes 142, and may have dielectric characteristics. In addition, capacitor support pads 150 may have a low etch rate to a LAL (low ammonium fluoride liquid chemical) etchant when an LAL lift-off process is used to remove the mold oxide layer.

The capacitor support pads 150 may be nitride layers or oxide layers formed of a material selected from the group consisting of SiN, SiCN, TaO, and $TiO_2$ but the material is not limited thereto. In current embodiments, capacitor support pads 150 may be formed of a material that is resistant to tensile stress and wet etching so that they reduce tearing of the capacitor at cell block edges. If capacitor support pads 150 are formed of, for example, SiN layers, then density of the SiN layers may be lowered by performing plasma enhanced chemical vapor deposition (PECVD) or low pressure CVD (LPCVD) to enhance tensile stress thereof, and capacitor support pads 150 may be doped with carbon (C) to enhance resistance thereof to wet etching (see FIGS. 4 and 8 for more details).

Capacitor support pads 150 may have a thickness in the range of 500 to 1,500 Angstroms to stably support the cylindrical lower electrodes 142, but thicknesses thereof are not limited thereto.

In current embodiments, since capacitor support pads 150 are formed in stripes between the cylindrical lower electrodes 142, dielectric layer 144 may be symmetrically and uniformly formed on an entire surface of the cylindrical lower electrodes 142 including upper and lower surfaces of capacitor support pads 150, and upper electrodes 146 may also be uniformly formed. Deterioration of electric characteristics due to asymmetrical and/or non-uniform deposition of subsequent materials may also be reduced.

Heights of cylindrical lower electrodes 142 on which capacitor support pad 150 is not formed may be less than that of other lower electrodes 142 on which capacitor support pad 150 are formed, since cylindrical lower electrodes 142 are etched and removed when capacitor support pads 150 are etched during patterning of capacitor support pads 150. However, capacitor support pads 150 may be selectively etched using proper etching so that all cylindrical lower electrodes 142 are the same in height.

Although in current embodiments, capacitor support pads 150 are formed between the upper portions of cylindrical lower electrodes 142, they may be formed between parts of the cylindrical lower electrodes 142, which are lower than the upper portions of the cylindrical lower electrodes 142. In addition, although not shown, a lower part of the mold oxide layer, for example, up to a thickness in the range of 1,000 to 2,000 Angstroms, may remain between cylindrical lower electrodes 142 when the mold oxide layer is etched to more securely reduce collapse of cylindrical lower electrodes 142.

Figure 3A:
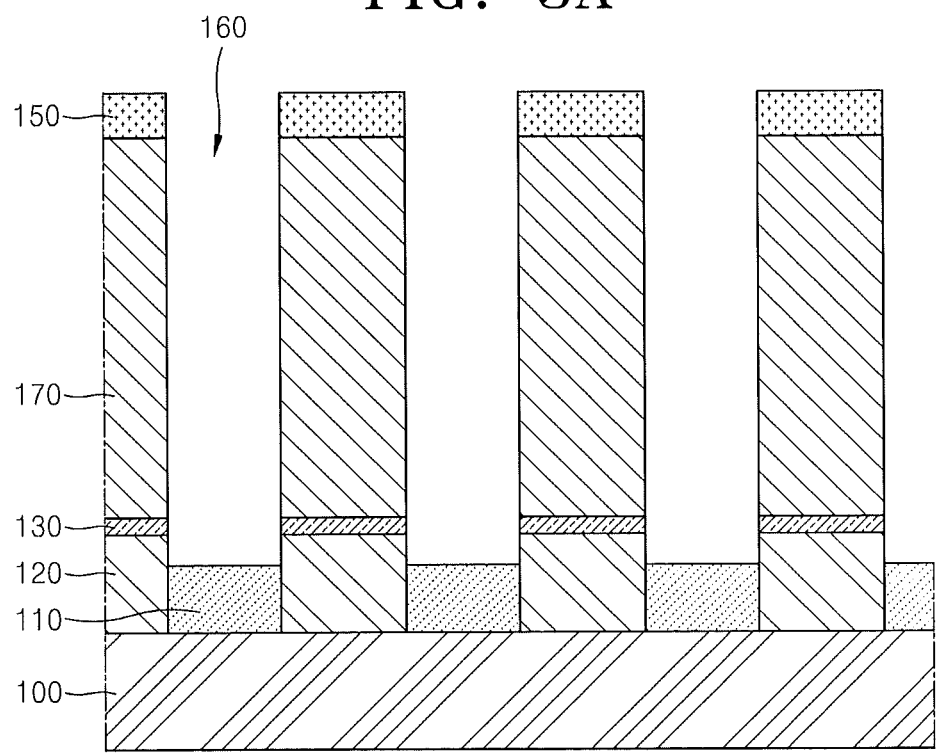
FIGS. 3A to 3G are cross-sectional views sequentially illustrating operations of fabricating the semiconductor device of FIG. 2, according to embodiments of the present invention.

FIGS. 3A to 3G are cross-sectional views sequentially illustrating operations of fabricating the semiconductor device of FIG. 2, according to some embodiments of the present invention. Referring to FIG. 3A, contact lines 110 and inter-layered insulation layers 120 are formed on a semiconductor substrate 100 in which a cell region and a peripheral or core region located outside the cell region are defined. A plurality of etch-stop layers 130 are formed of, for example, silicon nitride (SiN), on the contact lines 110 and inter-layered insulation layers 120. Contact lines 110 may be, for example, storage node contact plugs which are electrically connected to conductive regions of the cell region of semiconductor substrate 100.

Mold oxide layer 170 is formed on an entire surface of each of the etch-stop layers 130, and a support pad layer (not shown) used to form capacitor support pads 150 is formed on the mold oxide layer 170. Mold oxide layer 170 may be formed of a material selected from the group consisting of $SiO_2$, high density plasma oxide (HDP), tetra ethyl ortho silicate (TEOS), low hydrogen TEOS (LHTEOS), and boron phosphorous silicate glass (BPSG). The capacitor support pad layer may be formed of a material having an etching selectivity which is lower than that of mold oxide layer 170. In addition, the capacitor support pad layer may be formed of a material having a low etch rate with respect to an LAL etchant when the LAL lift-off process is used to remove the mold oxide layers 170 and the support pad layer may have dielectric properties.

In current embodiments, the capacitor support pad layer may be patterned into capacitor support pads 150 used to support cylindrical lower electrodes 142 of cylindrical capacitor 140 that will be described later with reference to FIG. 3B. Thus, capacitor support pads 150 may be nitride layers or oxide layers formed of a material selected from the group consisting of SiN, SiCN, TaO, and $TiO_2$. Also, capacitor support pads 150 may be formed of a material that is resistant to tensile stress and wet etching to reduce tearing of the capacitor at the block edges. For example, capacitor support pads 150 may be C—SiN layers obtained by PECVD or LPCVD. Here, a C—SiN layer means an SiN layer doped with carbon, and may also be referred to as a C-HTSiN (C-doped High Temperature SiN) layer because PECVD or LPCVD is performed at a relatively high temperature relative to temperatures of other CVD processes.

If the C—SiN layer is formed by PECVD or LPCVD, then at least one silicon source gas selected from the group consisting of DCS ($SiH_2Cl_2$), HCD($Si_2Cl_6$), TCS($SiHCl_3$), $SiH_4$, and BTBAS(($C_4H_9NH)_2SiH_2$), a CM), gas, an $N_2$ gas, and an $NH_3$ gas may be used. For example, the capacitor support pads 150 may be formed of the C—SiN material to a thickness in the range of 500 to 1,500 Angstroms.

Properties of the C—SiN (or C-HTSiN) layer used to form capacitor support pads 150 according to current embodiments will be described in detail with reference to FIGS. 4 to 8 below.

If capacitor support pads 150 are formed between portions of cylindrical lower electrodes 142, which are lower than upper portions of cylindrical lower electrodes 142, then capacitor support pads 150 may be obtained by patterning the capacitor support pad layer into stripes according to a photo resist (PR) patterning process. The mold oxide layers 170 may be formed to an appropriate thickness on the resultant structure, and subsequent processes which will be described later may be performed. In this case, since the capacitor support pads 150 have already been patterned, PR patterning processes that will be described with reference to FIGS. 3D and 3E may be omitted.

In addition, in current embodiments, mold oxide layers 170 may be formed of a material selected from the group consisting of $SiO_2$, HDP, TEOS, LHTEOS, and BPSG. Embodiments of the present invention, however are not limited thereto, and mold oxide layers 170 may each be a stacked structure of various oxide layers formed of at least two materials selected from the group consisting of HDP, TEOS, LHTEOS, and BPSG.

After capacitor support pads 150 are formed, a plurality of holes 160 are formed at locations where the cylindrical lower electrodes 142 are to be formed, respectively. Holes 160 may be formed by etching the capacitor support pad layer, the mold oxide layers 170, and the etch-stop layers 130 using a PR mask or a hard mask until the contact lines 110 are exposed. The holes 160 may be formed such that the cylindrical lower electrodes 142 that are to be formed are formed in a matrix of rows and columns. In addition, holes 160 may also be formed to be arranged in diagonal lines. Alternatively, holes 160 may be formed to arrange the cylindrical lower electrodes 142 in a zigzag pattern to increase the space.

The capacitor support pad layers may have a greater thickness than a desired thickness of capacitor support pads 150 in consideration of an amount of the capacitor support pad layers that are etched when the etch-stop layers 130 are etched. Also, as will be described later with reference to FIG. 9, the capacitor support pad layers may be formed of a material having an etching selectivity lower than that of the etch-stop layer 130 so that even if widths of etch-stop layers 130 are increased, distances between capacitor support pads 150 may be maintained at a predetermined level or less.

Figure 3B:
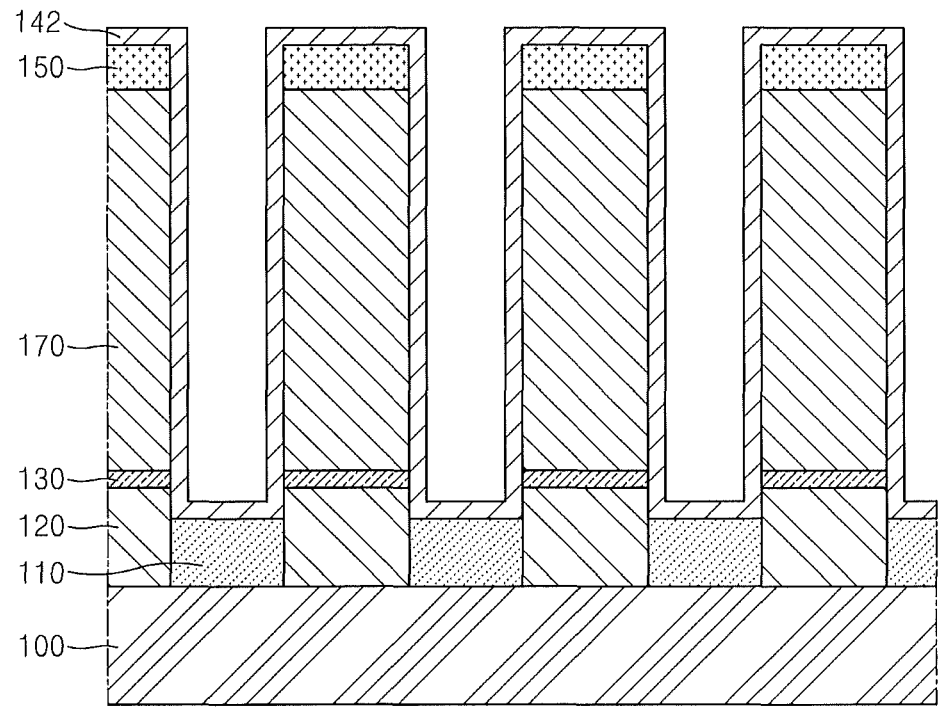

Referring to FIG. 3B, cylindrical lower electrodes 142 are formed by applying a conductive material onto all surfaces of a resultant structure of the semiconductor substrate 100, that is, on inner surfaces of holes 160 and capacitor support pad layers 150. If an upper mold oxide layer is further formed on capacitor support pads 150 so that capacitor support pads 150 are lower than upper portions of the cylindrical lower electrodes 142, then a conductive material may be applied on the upper mold oxide layer on the capacitor support pads 150.

Figure 3C:
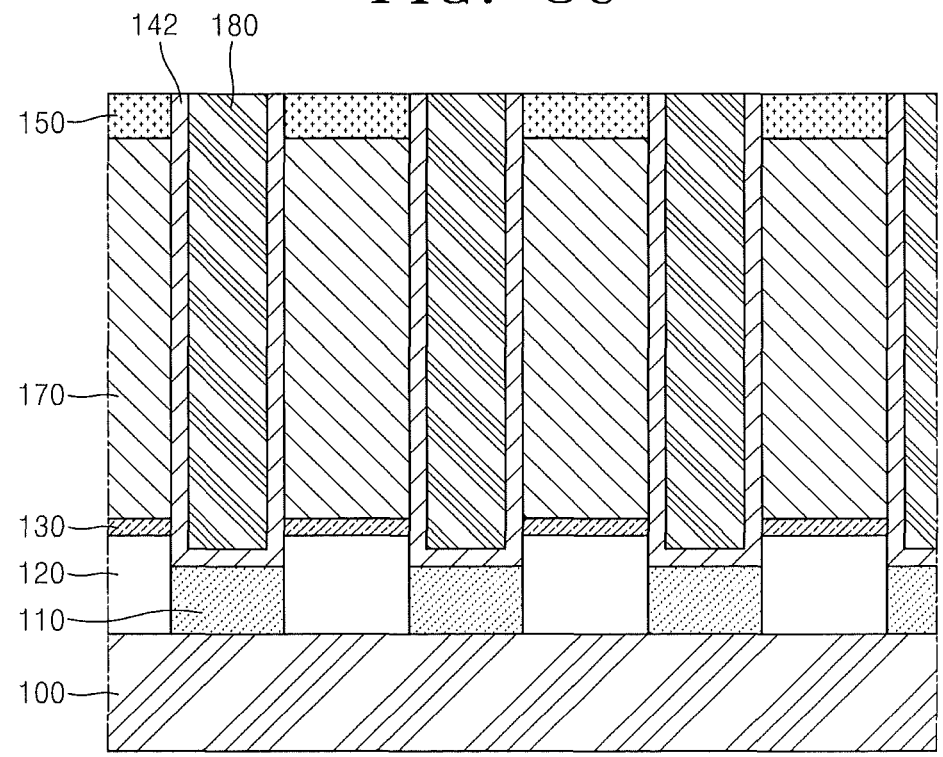

Referring to FIG. 3C, after cylindrical lower electrodes 142 are formed, an oxide layer 180 is formed on an entire surface of a resultant structure of the semiconductor substrate 100 so that holes defined by cylindrical lower electrodes 142 may be completely filled up. Then, oxide layer 180 is subject to planarization and removal until capacitor support pads 150 are exposed by chemical mechanical planarization (CMP) to separate the cylindrical lower electrodes 142, that is, to perform node separation. If an upper mold oxide layer remains on capacitor support pads 150, oxide layer 180 is planarized until the upper mold oxide layer is exposed.

Figure 3D:
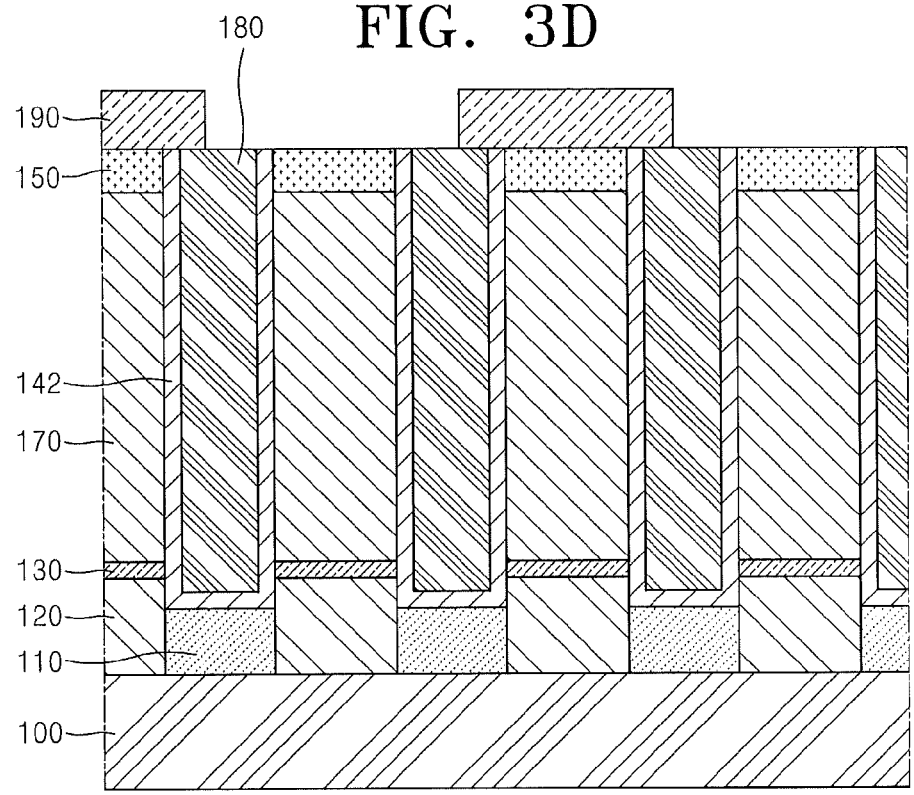

Referring to FIG. 3D, after the planarization process is performed, a PR (photoresist) pattern 190 is formed on the resulting structure of FIG. 3C using an exposure process to pattern the capacitor support pads 150. The PR pattern 190 may be formed such that capacitor support pads 150 are formed, for example, in stripes to connect a pair of neighboring rows, columns, or diagonal lines of cylindrical lower electrodes 142.

To form lattice type capacitor support pads, a micro-sized PR pattern may be used to form capacitor support pads between all lower electrodes. Accordingly, the exposure process may be difficult to perform due to problems such as alignment. However, since capacitor support pads 150 according to current embodiments are formed in stripes, a PR pattern having a relatively simple shape and a relatively large size may be formed, and thus the exposure process to form the PR pattern may be performed relatively easily.

As illustrated in FIGS. 1A to 1D, a PR pattern 190 may be formed such that capacitor support pads 150 extend to a cell block edge in consideration of an amount of a capacitor support pad material that melts during subsequent wet etching of mold oxide layer 170. In some cases, PR pattern 190 may be formed such that each two or more of capacitor support pads 150 are connected at cell block edges.

Figure 3E:
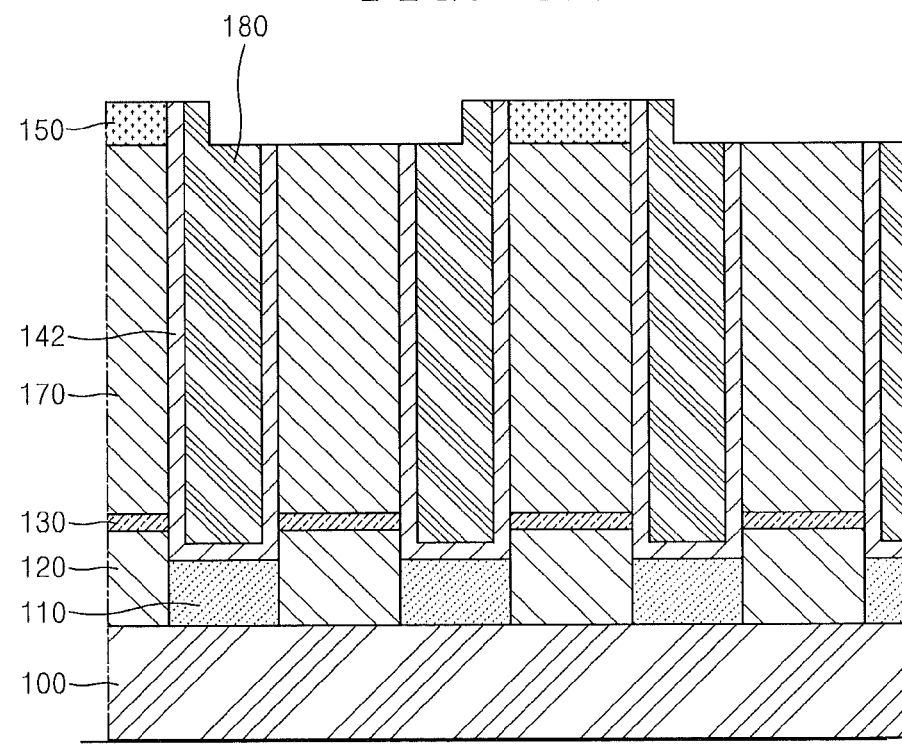

Referring to FIG. 3E, capacitor support pads 150 formed in stripes and extending in parallel in various directions as described above are formed by dry etching capacitor support pads 150 by using PR pattern 190. Capacitor support pads 150 may extend to the cell block edge as described above.

Capacitor support pads 150 are etched together with cylindrical lower electrodes 142, and thus, heights of cylindrical lower electrodes 142 on which capacitor support pads 150 are not formed may be less than that of cylindrical lower electrodes 142 on which capacitor support pads 150 are formed, respectively. However, cylindrical lower electrodes 142 may not be etched when capacitor support pads 150 are etched using an appropriate etching method, for example, using an etching gas having different etch rates with respect to capacitor support pads 150 and cylindrical lower electrodes 142.

As described above, if the PR patterning process is performed so that capacitor support pads 150 may be lower than upper portions of cylindrical lower electrodes 142 before a mold oxide layer is formed on capacitor support pads 150, then patterning of capacitor support pads 150 according to the PR patterning processes described above with reference to FIGS. 3D and 3E may be skipped.

Figure 3F:
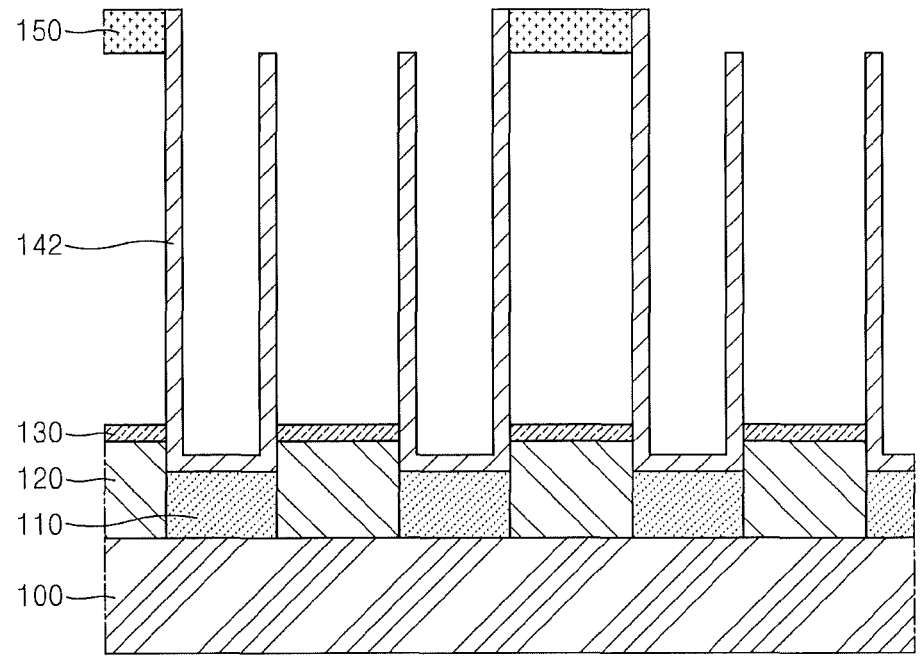

Referring to FIG. 3F, after capacitor support pads 150 are formed in stripes, mold oxide layers 170 and oxide layers 180 are removed by wet etching, for example, using an LAL lift-off process.

Figure 3G:
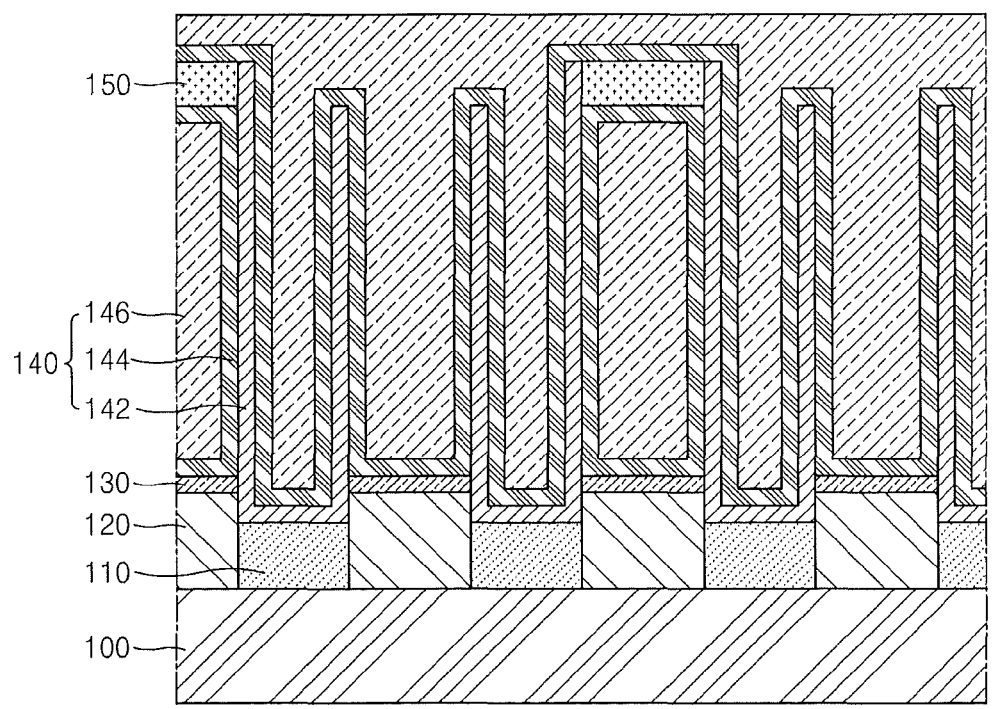

Referring to FIG. 3G, a dielectric material is applied onto entire surfaces of the resultant structure where oxide layers 180 and mold oxide layers 170 are removed to form dielectric layers 144, and a conductive material is applied onto dielectric layers 144 to form upper electrodes 146, thereby obtaining a plurality of cylindrical capacitors 140.

In current embodiments, dielectric layers 144 and upper electrodes 146 are symmetrically and uniformly formed after wet etching and removing mold oxide layers 170 and oxide layers 180, owing to a sufficient space between cylindrical lower electrodes 142 obtained by forming capacitor support pads 150 in stripes. Accordingly, deterioration of electrical characteristics due to non-uniform deposition of materials may be reduced. Also, capacitor support pads 150 may be formed of a material that is resistant to tensile stress and wet etching, thereby reducing tearing of the capacitor at a cell block edge. For example, capacitor support pads 150 may be C-HTSiN layers formed by PECVD or LPCVD.

Figure 4:
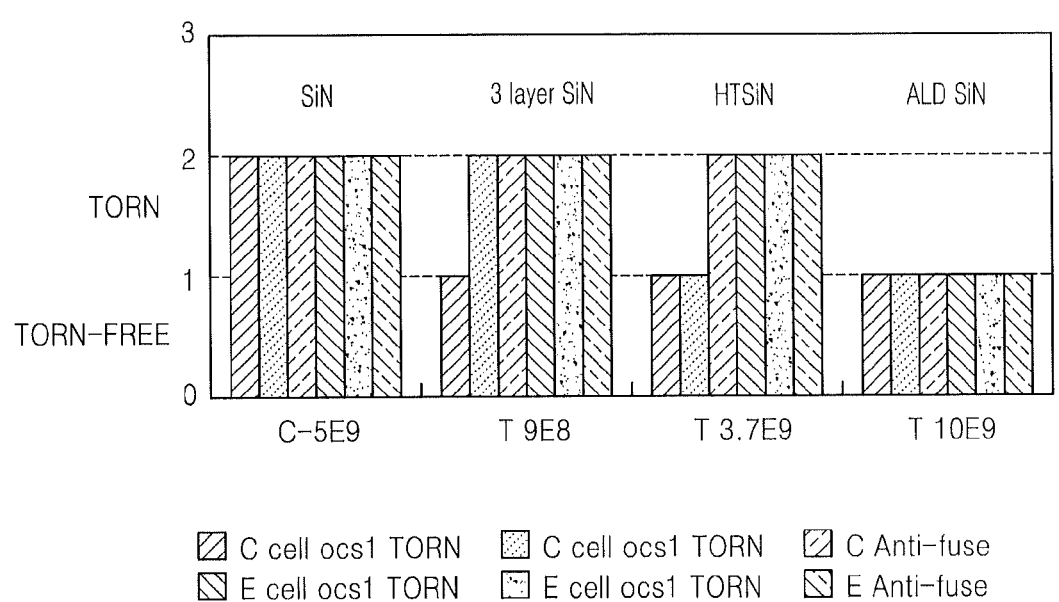
FIG. 4 is a graph showing an amount that a capacitor is torn versus a stress of layers used for forming capacitor support pads.

FIG. 4 is a graph showing an amount that a capacitor is torn versus a stress of layers used to form capacitor support pads. The graph of FIG. 4 sequentially illustrates amounts that a capacitor or an anti-fuse is torn in a general SiN layer, a triple-layered SiN layer, a high-temperature (HT) SiN (HTSiN) layer, and an atomic layer deposition (ALD) SiN layer, respectively.

Here, the HTSiN layer means an SiN layer formed at a relative high temperature, and the ALD SiN layer means an SiN layer formed by ALD. In FIG. 4, the x-axis denotes a compressive stress or tensile stress of these SiN layers, where 'C' denotes a compressive stress and 'T' denotes a tensile stress. Also, 'C cell ocs1' denotes a capacitor having an OCS structure at the center of a cell region, and 'E cell ocs1' denotes a capacitor having an OCS structure at a cell block edge which is a boundary of the cell region. An anti-fuse also has an OCS structure and is thus considered here.

The graph of FIG. 4 shows that the higher the tensile stress of a layer, the less the a capacitor may be torn, and shows that the amount that a capacitor is torn when the capacitor is located at the cell block edge may be greater than at the center of the cell region. In conclusion, tearing of a capacitor may be reduced at the cell block edge by increasing a tensile stress of a SiN layer used to form a capacitor support pad. To this end, the density of the SiN layer may be reduced to increase a tensile stress thereof. Accordingly, PECVD or LPCVD may be performed to form the SiN layer.

Figure 5:
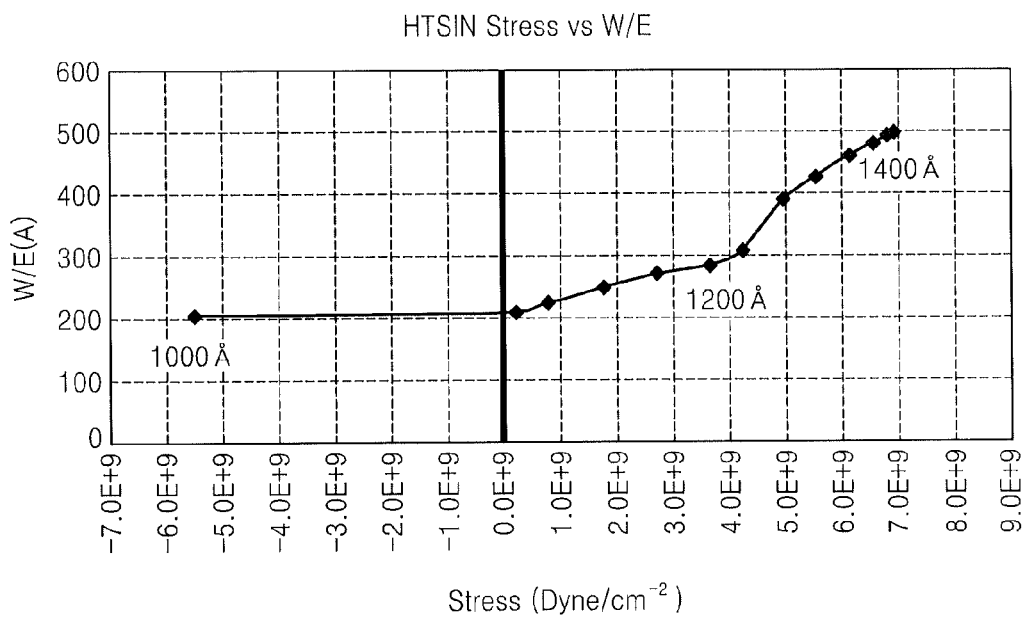
FIG. 5 is a graph showing amounts that a high-temperature (HT) SiN (HTSiN) layer is wet etched versus a compressive stress and a tensile stress applied to the HTSiN layer.

FIG. 5 is a graph showing amounts that an HTSiN layer is wet etched versus a compressive stress and a tensile stress of the HTSiN layer. In the graph of FIG. 5, a right part denotes an amount that the HTSiN layer is wet etched versus a tensile stress of the HTSiN layer, and a left part denotes the amount that the HTSiN layer is wet etched versus a compressive stress of the HTSiN layer with respect to a thick central line. The x-axis denotes a stress of the HTSiN layer in Dyne/cm$^{-2}$, and the y-axis denotes an amount in Angstroms that the HTSiN layer is etched according to the LAL lift-off process.

The graph of FIG. 5 shows that an amount that the HTSiN layer is etched is relatively uniform with respect to compressive stresses of the HTSiN layer. The higher a tensile stress of the HTSiN layer, however, the greater the amount that the HTSiN layer is etched.

If a tensile stress of a capacitor support pad is increased to reduce tearing of the capacitor, then an amount that the capacitor support pad is to be etched during removal of a mold oxide layer or an oxide layer according to the LAL lift-off process should be considered. Thus, a support pad layer may need to be formed thick to a predetermined thickness or higher in consideration of an amount that the capacitor support pad is to be etched. 1,000 Angstroms, 1,200 Angstroms, and 1,400 Angstroms marked on the graph of FIG. 5 mean the thicknesses of the capacitor support pad layer required to form the capacitor support pad. That is, the capacitor support pad may be formed to a thickness of 1,000 Angstroms when the HTSiN layer has a predetermined compressive stress but should be formed thicker, e.g., to a thickness in the range of 1,200 to 1,400 Angstroms, when a tensile stress of the HTSiN layer is high.

Figure 6:
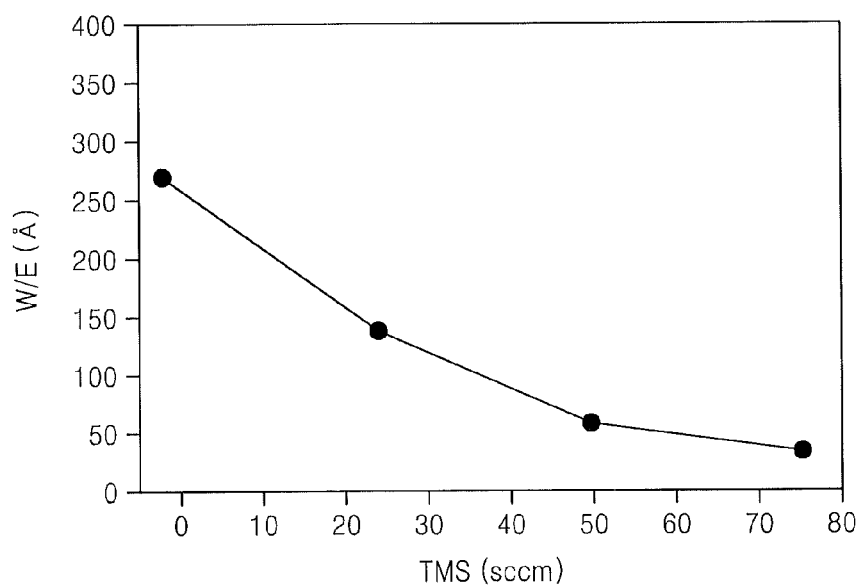
FIG. 6 is a graph showing an amount that a HTSiN layer is wet etched versus the carbon (C) content thereof.

FIG. 6 is a graph showing an amount that an HTSiN layer is wet etched versus the carbon (C) content thereof. The x-axis denotes the concentration of the carbon contained in the HTSiN layer and the y-axis denotes an amount that the HTSiN layer is wet etched. In FIG. 6, 'TMS' stands for Tetramethysilane, i.e., a carbon-containing source gas.

Referring to FIG. 6, the higher the concentration of the carbon contained in the HTSiN layer, the less the amount that the HTSiN layer is wet etched. Accordingly, it is concluded from the graphs of FIGS. 4 to 6 that tearing of the capacitor may be reduced at a cell block edge, and the capacitor support pad may be resistant to wet etching, such as the LAL lift-off process when the capacitor support pad is formed of a material that is resistant to tensile stress and that contains a predetermined amount of carbon.

Figures 7, 8:
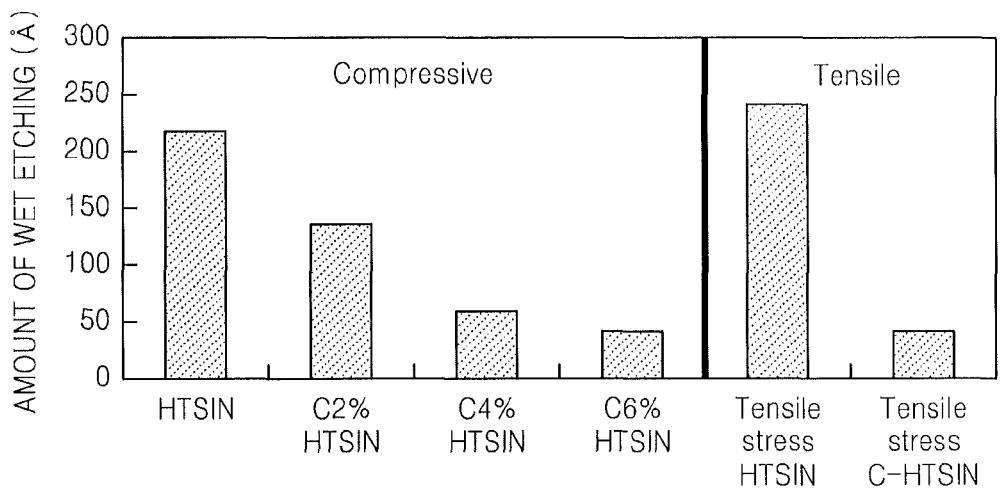
FIG. 7 is a graph showing amounts that a HTSiN layer is wet etched versus a compressive stress and a tensile stress applied to the HTSiN layer, according to the carbon (C) content of the HTSiN layer.
FIG. 8 is a table comparing the quality of C-HTSiN layers used to form a capacitor support pad according to some embodiments of the present invention with the quality of a general HTSiN layer, based on carbon (C) content thereof.

FIG. 7 is a graph showing amounts that the HTSiN layer is wet etched versus a compressive stress and a tensile stress of the HTSiN layer, based on the carbon (C) content of the HTSiN layer. Referring to FIG. 7, the greater the carbon content of the HTSiN layer, the less the amount that the HTSiN layer is wet etched when the HTSiN layer is under a compressive stress, and the greater the carbon content of the HTSiN layer, the less the amount that the HTSiN layer is wet etched when the HTSiN layer has a tensile stress. In this case, the tensile stress of a carbon-containing HTSiN layer, i.e., a C-HTSiN layer, is approximately 4.6E+09 (Dyne/cm$^{-2}$).

FIG. 8 is a table comparing the quality of C-HTSiN layers used to form a capacitor support pad according to some embodiments of the present invention with the quality of a general HTSiN layer, based on the carbon (C) contents thereof. Here, 'C-HTSiN1' and 'C-HTSiN2' denote carbon-containing HTSiN layers that have different tensile stresses relative to each other. The C-HTSiN1 layer has a tensile stress of about 330 MPa and the C-HTSiN2 layer has a tensile stress of about 500 MPa.

Referring to FIG. 8, the general HTSiN layer, the C-HTSiN1 layer, and the C-HTSiN2 layer are formed at similar deposition temperatures or at similar deposition rates, and the thickness uniformities of the general HTSiN layer, the C-HTSiN1 layer, and the C-HTSiN2 layer are all 3% or less. However, the wet etching rates (WERs) of the general HTSiN layer, the C-HTSiN1 layer, and the C-HTSiN2 layer are greatly different from one another according to whether they contain carbon. That is, both the WERs of the C-HTSiN1 layer and the C-HTSiN2 layer that contain carbon are about 3 Angstroms/min but the WER of the general HTSiN is about 12 Angstroms/min and is thus about four times greater than those of the C-HTSiN1 layer and the C-HTSiN2 layer.

Accordingly, it is concluded from the graphs and table of FIGS. 4 to 8 that it is possible to effectively reduce tearing of a capacitor at a cell block edge and to enhance the resistance of a capacitor support pad to wet etching by forming the capacitor support pad of a material that is resistant to tensile stress and that has a predetermined amount of carbon. For example, an HTSiN layer that has a tensile stress of 50 to 1000 MPa and that is doped with about 2 to 6% of carbon by mass may be used to form a capacitor support pad.

Figure 9:
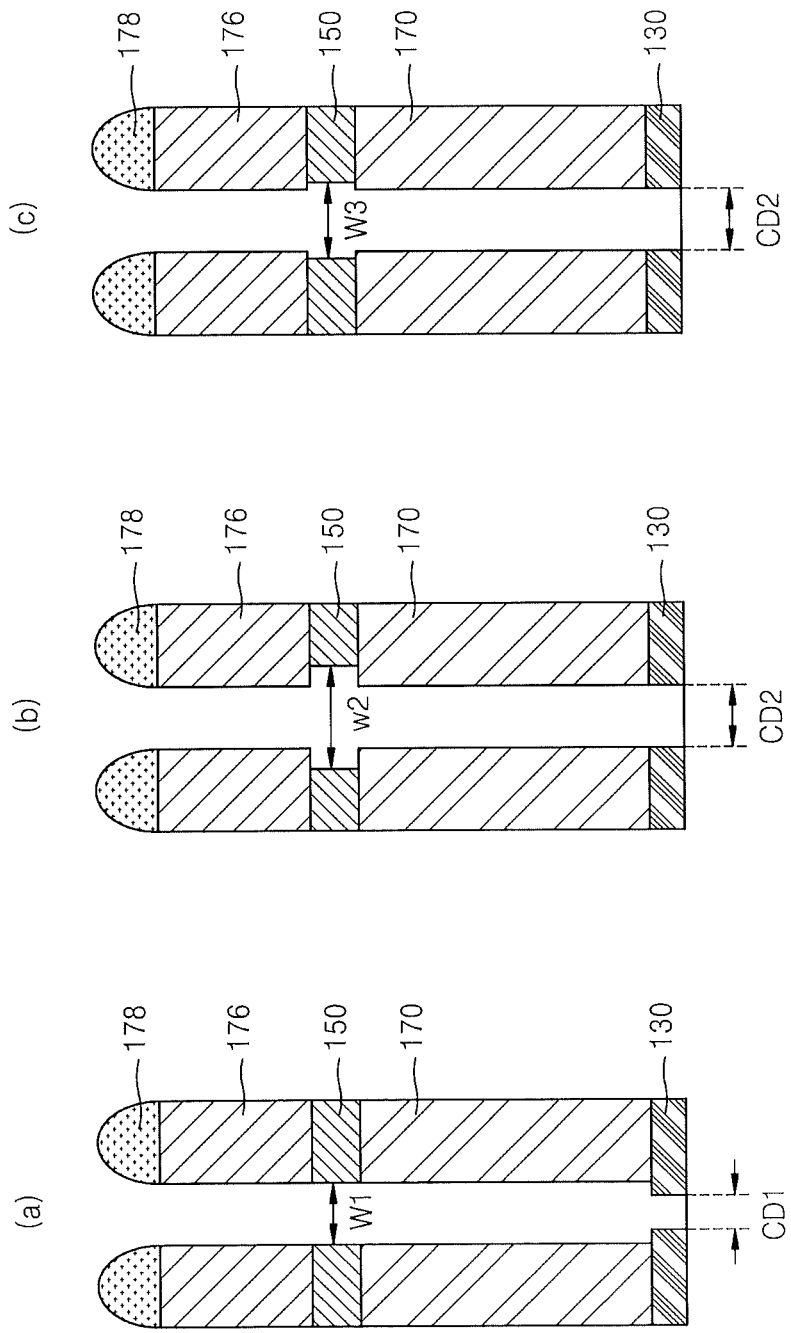
FIG. 9 is a cross-sectional view illustrating various distances between capacitor support pads, by increasing distances between etch-stop layers to provide a sufficient low contact critical dimension (CD) of a capacitor, according to some embodiments of the present invention.

FIG. 9 is a cross-sectional view illustrating various distances between capacitor support pads, by increasing the distance between etch-stop layers to ensure a sufficient low contact critical dimension (CD) of a capacitor, according to some embodiments of the present invention. First, referring to FIG. 9(a), an amount that each etch-stop layer 130 is etched may be less than that of other layers that are etched when forming a hole for a lower electrode when capacitor support pads 150 and etch-stop layers 130 are formed of materials that have similar etching selectivity, e.g., when capacitor support pads 150 and etch-stop layers 130 are a SiN or HTSiN layer. Thus, a distance W1 between the capacitor support pads 150 (or the width W1 of the hole) may be greater than the distance CD1 between the etch-stop layers 130. In FIG. 9, reference numeral 176 denotes an upper mold oxide layer, and reference numeral 178 denotes a mask used to form the hole, e.g., a PR (photoresist) mask or a hard mask.

If etching is further performed to increase the distance between the etch-stop layers 130 to secure a lower contact CD of the lower electrode, capacitor support pads 150 are also etched, and widths of capacitor support pads 150 thus decrease (or becomes thin), thereby causing bridging problems. For example, referring to FIG. 9(b), if the distance CD1 of etch-stop layers 130 in FIG. 9 (a) is increased to CD2, distance W1 between the capacitor support pads 150 in FIG. 9 (a) is increased by the difference between the distances CD2 and CD1, thus increasing to the distance W2.

As described above, resistance of an SiN or HTSiN layer to etching may be enhanced by adding carbon thereto. Thus, if capacitor support pads 150 are formed of an SiN or HTSiN layer doped with carbon, a distance between capacitor support pads 150 may be maintained at a predetermined level or less even when etching is further performed to increase a distance between the etch-stop layers 130. Referring to FIG. 9(c), a distance between the capacitor support pads 150 may increase to W3, which is slightly greater than W1, even when etching is further performed to increase a distance between the etch-stop layers 130 to CD2. A ratio of the etching selectivity of an HTSiN layer that contains carbon to the etching selectivity of an HTSiN layer that does not contain carbon may be controlled to be about 1:5 by appropriately adjusting the amount of carbon doped into these layers.

Figure 10:
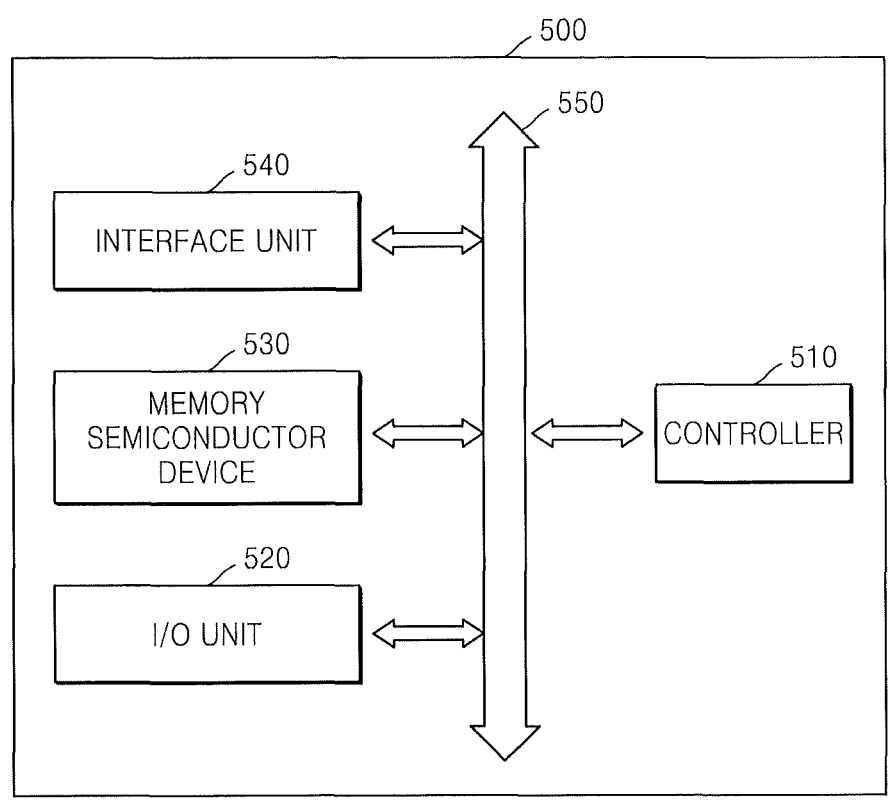
FIG. 10 is a block diagram of an electric/electronic apparatus according to some embodiments of the present invention.

FIG. 10 is a block diagram of an electric/electronic apparatus 500 according to some embodiments of the present invention. Referring to FIG. 10, the electric/electronic apparatus 500 may include a controller 510, an input/output (I/O) unit 520, a semiconductor memory device 530, an interface unit 540, and a bus 550.

Controller 510 may include at least one processor configured to perform a command, e.g., a microprocessor, a digital signal processor, or a microcontroller. The controller 510 may perform overall control of the other elements of the electric/electronic apparatus 500, i.e., I/O unit 520, semiconductor memory device 530, and interface unit 540 via bus 550.

I/O unit 520 may receive data or a signal from and/or may supply data or a signal to the outside of the electric/electronic apparatus 500. For example, the I/O unit 520 may include a keyboard, a keypad, or a display device.

Semiconductor memory device 530 may be a semiconductor device having an OCS structure as described above with reference to FIGS. 1 and 2. In this case, semiconductor memory device 530 may include a plurality of capacitor support pads to support lower electrodes and the plurality of capacitor support pads may be formed of a material, the tensile stress of which is greater than a predetermined level and that is resistant to wet etching. Thus, in semiconductor memory device 530, tearing of a capacitor may be reduced at a cell block edge. Semiconductor memory device 530 stores pieces of data or commands that are input or output via the I/O unit 520, and that are received or transferred to the other elements of the electric/electronic apparatus 500.

Interface unit 540 may exchange data with an external device via a network, and bus 550 transmits data and commands among I/O unit 520, memory semiconductor device 530, interface unit 540, and controller 510.

In current embodiments, electric/electronic apparatus 500 may be used in mobile apparatuses, e.g., personal digital assistants (PDAs), mobile computers, web tablets, wireless phones, mobile phones, digital music players, memory cards, or data transmission or receiving apparatuses.

While inventive concepts have been particularly shown and described with reference to examples of embodiments thereof, it will be understood that various changes in form and details may be made therein without departing from the spirit and scope of the following claims.

What is claimed is:

1. A semiconductor device comprising:
    a semiconductor substrate;
    a plurality of three-dimensional capacitors on the semiconductor substrate wherein each of the plurality of three-dimensional capacitors includes a first three-dimensional electrode, a capacitor dielectric layer, and a second three-dimensional electrode with the first three-dimensional electrode between the capacitor dielectric layer and the semiconductor substrate and with the capacitor dielectric layer between the first and second three-dimensional electrodes;
    a plurality of capacitor support pads with each capacitor support pad being arranged between adjacent first three-dimensional electrodes of adjacent three-dimensional capacitors with portions of the capacitor dielectric layers between the capacitor support pads and the semiconductor substrate, wherein each of the capacitor support pads comprises silicon nitride that is doped with carbon in the range of about 2% to about 6% by mass; and
    an etch stop layer on the semiconductor substrate and including a plurality of holes therethrough corresponding to the respective plurality of first three-dimensional electrodes, wherein the capacitor support pads comprise a material having an etch rate that is lower than an etch rate of the etch-stop layer.

2. The semiconductor device of claim 1 wherein the plurality of three-dimensional capacitors are arranged in rows and columns, and wherein each of the plurality of capacitor support pads is arranged in a linear stripe between adjacent rows of the three-dimensional capacitors, between adjacent columns of the three-dimensional capacitors, or along a diagonal between adjacent pairs of the three-dimensional capacitors.

3. The semiconductor device of claim 1 wherein each of the capacitor support pads comprises a carbon-doped high-temperature silicon nitride (HTSiN) layer.

4. The semiconductor device of claim 1 wherein each of the capacitor support pads is in direct contact with first three-dimensional electrodes of respective three-dimensional capacitors.

5. The semiconductor device of claim 1,
    wherein portions of each of the first three-dimensional electrodes extends through a corresponding hole through the etch stop layer, and wherein the etch stop layer is in direct contact with each of the first three-dimensional electrodes.

6. The semiconductor device of claim 5 further comprising:
    a plurality of conductive layers corresponding to the plurality of first three-dimensional electrodes, wherein each of the plurality of conductive layers provides electrical coupling between a respective one of the first three-dimensional electrodes and the semiconductor substrate.

7. The semiconductor device of claim 1 wherein each of the capacitor support pads has a tensile stress in the range of about 50 MPa to about 1000 MPa.

8. The semiconductor device of claim 1 wherein each of the capacitor support pads has a tensile stress in the range of about 330 MPa to about 500 MPa.

9. The semiconductor device of claim 1 wherein the plurality of three-dimensional capacitors are arranged in an array on a cell region of the semiconductor substrate, and wherein each of the capacitor support pads extends to a boundary of the cell region.

10. The semiconductor device of claim 1 wherein each of the first three-dimensional electrodes includes a distal end spaced apart from the semiconductor substrate such that the distal end is adjacent a respective one of the capacitor support pads, and wherein the distal end includes a distal end portion spaced apart from the respective capacitor support pad that is recessed relative to a distal end portion adjacent to the respective capacitor support pad.

11. An electronic system comprising:
    an input/output unit through which data is input and/or output;
    an interface unit configured to receive and/or transmit the data;
    a semiconductor device comprising,
        a semiconductor substrate,
        a plurality of three-dimensional capacitors on the semiconductor substrate wherein each of the plurality of three-dimensional capacitors includes a first three-dimensional electrode, a capacitor dielectric layer, and a second three-dimensional electrode with the first three-dimensional electrode between the capacitor dielectric layer and the semiconductor substrate and with the capacitor dielectric layer between the first and second three-dimensional electrodes,
        a plurality of capacitor support pads with each capacitor support pad being arranged between adjacent first three-dimensional electrodes of adjacent three-dimensional capacitors with portions of the capacitor dielectric layers between the capacitor support pads and the semiconductor substrate, wherein each of the capacitor support pads comprises silicon nitride that is doped with carbon in the range of about 2% to about 6% by mass, and
        an etch stop layer disposed on the semiconductor substrate and including a plurality of holes therethrough corresponding to the respective plurality of first three-dimensional electrodes, wherein the capacitor support pads comprise a material having an etch rate that is lower than an etch rate of the etch-stop layer;
    a controller configured to control the input/output unit, the interface unit, and the semiconductor device; and
    a bus configured to provide communications coupling among the input/output unit, the interface unit, the semiconductor device, and the controller.

12. The method of claim 11 wherein each of the first three-dimensional electrodes includes a distal end spaced apart from the semiconductor substrate such that the distal end is adjacent a respective one of the capacitor support pads, and wherein the distal end includes a distal end portion spaced apart from the respective capacitor support pad that is recessed relative to a distal end portion adjacent to the respective capacitor support pad.

13. A method of forming a semiconductor device, the method comprising:
    providing a semiconductor substrate including a plurality of conductive layers thereon;

forming an etch-stop layer on the semiconductor substrate including the conductive layers;

forming a mold oxide layer on the etch stop layer;

forming a support pad layer on the mold oxide layer wherein the support pad layer and the mold oxide layer comprise different materials;

forming a plurality of holes through the support pad layer, the mold oxide layer, and the etch-stop layer with each hole exposing a portion of a respective one of the conductive layers;

forming a plurality of first three-dimensional electrodes with each of the first three-dimensional electrodes being formed on sidewalls of a respective one of the holes;

patterning the support pad layer to form a plurality of capacitor support pads, wherein each of the capacitor support pads is arranged between adjacent first three-dimensional electrodes in a stripe, wherein each of the capacitor support pads comprises silicon nitride that is doped with carbon in the range of about 2% to about 6% by mass, wherein the support pad layer comprises a material having an etch rate that is lower than etch rates of the etch-stop layer;

forming capacitor dielectric layers on the first three-dimensional electrodes; and forming second three-dimensional electrodes on the capacitor dielectric layers to thereby define a plurality of three-dimensional capacitors.

14. The method of claim 13 wherein the plurality of holes are arranged in rows and columns so that the plurality of first three-dimensional electrodes are arranged in rows and columns, and wherein each of the plurality of capacitor support pads is arranged in a linear stripe between adjacent rows of the first three-dimensional electrodes, between adjacent columns of the first three-dimensional electrodes, or along a diagonal between adjacent pairs of the first three-dimensional electrodes.

15. The method of claim 13 wherein the support pad layer comprises a carbon-doped high-temperature silicon nitride (HTSiN).

16. The method of claim 15 wherein forming the carbon-doped HTSiN support pad layer comprises forming the carbon-doped HTSiN layer using plasma enhanced chemical vapor deposition (PECVD) and/or low pressure chemical vapor deposition (LPCVD) with a deposition temperature of at least 550 degrees Celsius.

17. The method of claim 16 wherein forming the carbon-doped HTSiN layer comprises forming the carbon-doped HTSiN layer using a silicon source gas selected from the group consisting of $DCS(SiH_2Cl_2)$, $HCD(Si_2Cl_6)$, $TCS(SiHCl_3)$, $SiH_4$, and/or $BTBAS((C_4H_9NH)_2SiH_2)$, a carbon source gas selected from the group consisting of a $C_xH_y$ gas and/or $BTBAS((C_4H_9NH)_2SiH_2)$, and a nitrogen source gas selected from the group consisting of $N_2$, and/or $NH_3$.

18. The method of claim 13
wherein the etch-stop layer and the mold oxide layer comprise different materials, wherein the support pad layer comprises a material having an etch rate that is lower than an etch rate of the mold oxide layer, and wherein a ratio of the etch rate of the support pad layer to the etch rate of the mold oxide layer is about 1:5.

19. The method of claim 13
wherein the etch-stop layer and the mold oxide layer comprise different materials, and wherein a ratio of the etch rate of the support pad layer to the etch rate of the etch-stop layer is about 1:5.

20. The method of claim 13 wherein each of the capacitor support pads has a tensile stress in the range of about 50 MPa to about 1000 MPa.

21. The method of claim 13 wherein the support pad layer has a tensile stress in the range of about 330 MPa to about 500 MPa.

22. The method of claim 13 wherein the plurality of three-dimensional capacitors are arranged in an array on a cell region of the semiconductor substrate, and wherein each of the capacitor support pads extends to a boundary of the cell region.

23. The method of claim 13 wherein each of the first three-dimensional electrodes includes a distal end spaced apart from the semiconductor substrate such that the distal end is adjacent a respective one of the capacitor support pads, and wherein the distal end includes a distal end portion spaced apart from the respective capacitor support pad that is recessed relative to a distal end portion adjacent to the respective capacitor support pad.

* * * * *